US008208314B2

(12) United States Patent
Zimmerman

(10) Patent No.: US 8,208,314 B2
(45) Date of Patent: Jun. 26, 2012

(54) SEQUENTIAL ACCESS MEMORY ELEMENTS

(75) Inventor: Randy Zimmerman, Meridian, ID (US)

(73) Assignee: Aptina Imaging Corporation, George Town (KY)

( * ) Notice: Subject to any disclaimer, the term of this patent is extended or adjusted under 35 U.S.C. 154(b) by 213 days.

(21) Appl. No.: 12/791,226

(22) Filed: Jun. 1, 2010

(65) Prior Publication Data

US 2011/0292743 A1    Dec. 1, 2011

(51) Int. Cl.
*G11C 7/10* (2006.01)
(52) U.S. Cl. ......... 365/189.05; 365/185.18; 365/189.09; 365/154; 365/156
(58) Field of Classification Search ............. 365/189.05, 365/185.18, 189.09, 154, 156
See application file for complete search history.

(56) References Cited

U.S. PATENT DOCUMENTS

| 4,779,228 | A | 10/1988 | Uchiyama et al. |
| 4,930,108 | A | 5/1990 | Sugiyama |
| 5,444,660 | A | 8/1995 | Yamanaka et al. |
| 5,475,631 | A | 12/1995 | Parkinson et al. |
| 5,768,178 | A | 6/1998 | McLaury |
| 6,859,401 | B2 * | 2/2005 | Hosono et al. ........... 365/189.05 |

* cited by examiner

*Primary Examiner* — Jason Lappas
(74) *Attorney, Agent, or Firm* — Treyz Law Group; Jason Tsai

(57) ABSTRACT

Integrated circuits with sequential access memory cells are provided. A sequential access memory cell may include an inverter-like circuit, an inverter, a preset transistor, an access transistor, and a read circuit. The inverter-like circuit and the inverter are cross-coupled to form a bi-stable latch that is powered by a positive power supply line and that has first and second storage nodes. The preset transistor may be connected between the positive power supply line and the first storage node. The inverter-like circuit may include a transistor in its pull-down path. The preset transistor is enabled while the transistor is disabled to write a "1" at the first storage node. The access transistor may be used to write a "0" into the cell. The read circuit may be connected to the second storage node to read data from the cell without inducing a voltage rise at the second storage node.

20 Claims, 5 Drawing Sheets

SEQUENTIAL ACCESS MEMORY ELEMENTS

BACKGROUND

This relates to integrated circuits with memory elements, and more particularly, to memory elements with preset transistors.

Integrated circuits often contain memory elements. Memory elements may be based on cross-coupled inverters and may be used to store data. Each memory element may store a single bit of data.

Memory elements are often arranged in arrays. In a typical array, bit lines (data lines) are used to write data into the memory elements and are used to read data from memory elements that have been loaded with data. Word lines (address lines) may be used to select which of the memory elements are being accessed.

A memory element typically includes an n-channel access transistor that connects a bit line to an internal data storage node that is storing a data bit. The internal storage node can be driven by an output of an inverter-like circuit that is cross-coupled with an inverter.

During write operations, the n-channel access transistor can be used to write a "1" into the internal data storage node while disabling a pull-down current path in the inverter-like circuit. Writing a "1" into a memory element using an n-channel access transistor in this way may be slow and unreliable at extreme operating conditions.

It would therefore be desirable to provide improved memory elements.

DETAILED DESCRIPTION

This relates to integrated circuits and more particularly, to integrated circuits with sequential access memory (SAM) elements.

Integrated circuits that contain sequential access memory elements may include memory chips, digital signal processing circuits with memory arrays, microprocessors, application specific integrated circuits with memory arrays, and other integrated circuits.

Memory elements (cells) may be organized in arrays having numerous rows and columns. For example, memory array circuitry may be formed in hundreds or thousands of rows and columns on an integrated circuit.

In contrast to integrated circuits with random access memory (RAM) cells where data bits can be access in any random order, devices with sequential access memory access the memory cells in sequential order (i.e., data is read and written into SAM cells in sequence). Devices that use SAM cells may include hard disks, compact disc read-only memories (CD-ROMs), magnetic tapes, etc. (as examples).

Figure 1:
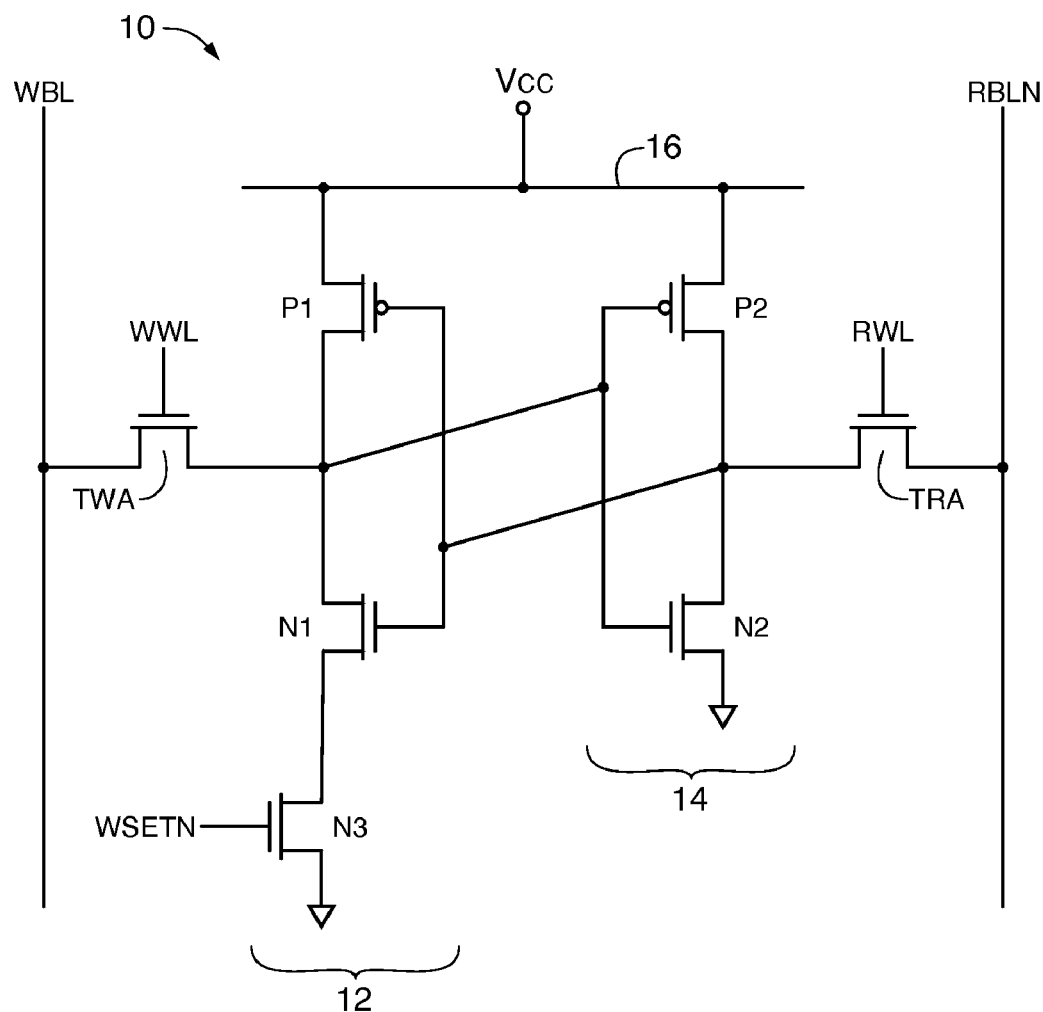
FIG. 1 is a circuit diagram of a conventional 7-transistor sequential access memory cell.

FIG. 1 shows a conventional 7-transistor (7-T) SAM cell. As shown in FIG. 1, 7-T SAM cell 10 includes an inverter-like circuit 12, an inverter 14, a write access transistor TWA, and a read access transistor TRA. Inverter-like circuit 12 has an output that is connected to an input of inverter 14, whereas inverter 14 has an output that is connected to an input of inverter-like circuit 12. Inverter-like circuit 12 and inverter 14 cross-coupled in this way form a storage portion (i.e., a latch) for SAM cell 10. The output of inverter-like circuit 12 drives a first data storage node, whereas the output of the inverter 14 drives a second data storage node. Each cell 10 may have a stored data bit held at the first data storage node.

Inverter-like circuit 12 includes a p-channel transistor P1 and n-channel transistors N1 and N3. Transistors P1, N1, and N3 are connected in series. Transistor P1 is connected between a positive power supply line 16 (i.e., a power supply line that is driven to positive power supply voltage Vcc) and the first data storage node. Transistors N1 and N3 are connected between the first data storage node and a ground power supply line to form a pull-down current path for circuit 12 (i.e., a ground line that is driven to zero volts). Transistors P1 and N1 have gates that are connected together to form the input of circuit 12, whereas transistor N3 has a gate that is controlled by signal WSETN.

Inverter 14 has a p-channel transistor P2 and an n-channel transistor N2 connected in series. Transistor P2 is connected between positive power supply line 16 and the second data storage node, whereas transistor N2 is connected between the second data storage node and the ground line. Transistors P2 and N2 have gates that are connected together to form the input of inverter 14.

Write access transistor TWA of cell 10 connects the first data storage node to a write bit line WBL, whereas read access transistor TRA connects the second data storage node to a read bit line RBLN (see, e.g., FIG. 1). Transistor TWA has a gate that is connected to a write word line WWL, whereas transistor TRA has a gate that is connected to a read word line RWL.

During write operations, WWL is asserted for a row of memory cells 10. Initially the WSETN is low and the entire row of bits will be preset to a logic "1." Signal WSETN is then pulled high. Write bit line WBL is driven high or low to write a logic "1" or "0" into cell 10. Write word line WWL is asserted to write the desired value into the first data storage node while signal WSETN is driven low to disable the pull-down current path of circuit 12 to provide increased write margins.

During read operations, read bit line RBLN is precharged to a high voltage. Read word line RWL is asserted to read data from cell 10. If cell 10 is storing a "1" (i.e., the first data storage node is storing a "1"), RBLN discharges towards zero volts through transistors TRA and N2. If cell 10 is storing a "0" (i.e., the first data storage node is storing a "0"), RBLN remains charged at the high voltage.

Memory cells of the type described in connection with FIG. 1 are referred to as dual-port memory cells, because separate read and write ports are used. This memory architecture is referred to as a pseudo-dual port memory because a row of bits is preset to a "1" by pulsing WSETN low. Individual bits within that row are the rewritten back to a "0." For standard dual port architectures, any bit within a row can be written to a "1" or "0."

Figure 2:
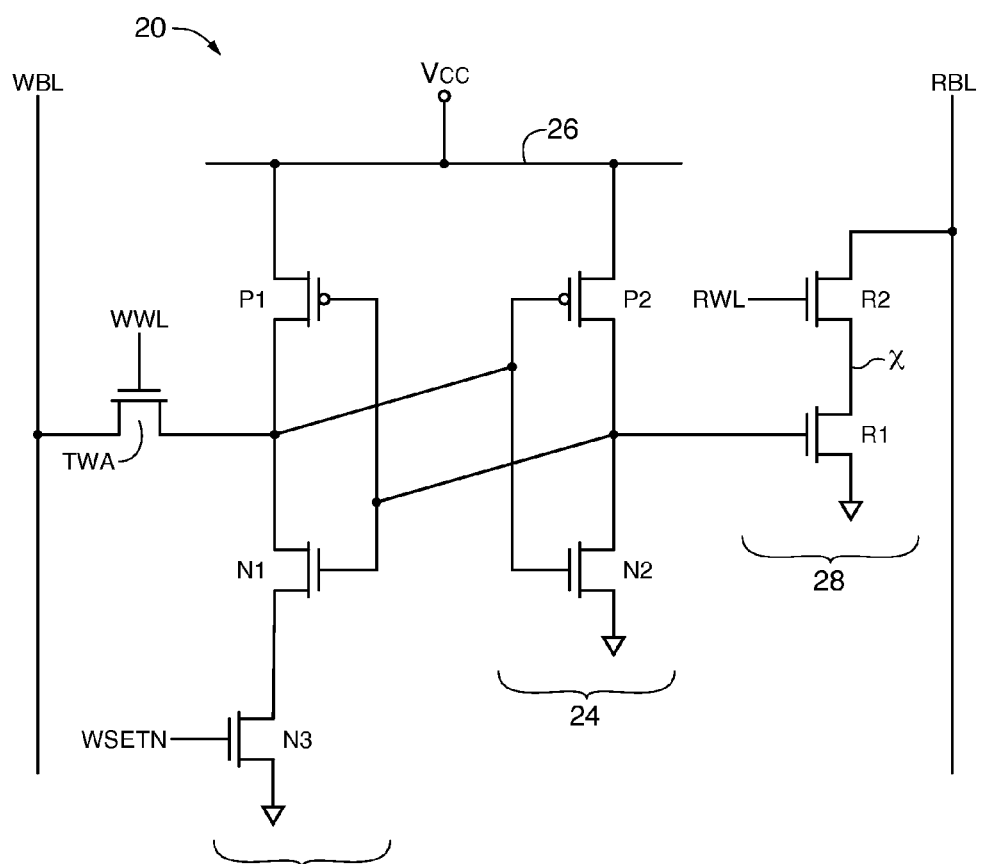
FIG. 2 is a circuit diagram of a conventional 8-transistor sequential access memory cell.

FIG. 2 shows a conventional 8-transistor (8-T) SAM cell. As shown in FIG. 2, 8-T SAM cell 20 includes an inverter-like circuit 22, an inverter 24, a write access transistor TWA, and a read circuit 28. Inverter-like circuit 22 has an output that is connected to an input of inverter 24, whereas inverter 24 has an output that is connected to an input of inverter-like circuit 22. Inverter-like circuit 22 and inverter 24 cross-coupled in this way form a storage portion (i.e., a latch) for SAM cell 20. The output of inverter-like circuit 22 drives a first data storage node, whereas the output of the inverter 24 drives a second data storage node. Each cell 20 may have a stored bit held at the first data storage.

Inverter-like circuit 22 includes a p-channel transistor P1 and n-channel transistors N1 and N3. Transistors P1, N1, and N3 are connected in series. Transistor P1 is connected between a positive power supply line 26 (e.g., a power supply line that is driven to positive power supply voltage Vcc) and the first data storage node. Transistors N1 and N3 are connected between the first data storage node and the ground line to form a pull-down current path for circuit 22. Transistors P1 and N1 have gates that are connected together to form the input of circuit 22, whereas transistor N3 has a gate that is controlled by signal WSETN.

Inverter 24 has a p-channel transistor P2 and an n-channel transistor N2 connected in series. Transistor P2 is connected between positive power supply line 26 and the second data storage node, whereas transistor N2 is connected between the second data storage node and the ground line. Transistors P2 and N2 have gates that are connected together to form the input of inverter 24.

Write access transistor TWA of cell 20 connects the first data storage node to a write bit line WBL. Transistor TWA has a gate that is connected to a write word line WWL.

Read circuit 28 includes n-channel transistors R1 and R2 connected in series. Transistor R1 has a drain terminal that is connected to an intermediate node X, a source terminal that is connected to the ground line, and a gate that is connected to the second data storage node. Transistor R2 has a drain terminal that is connected to a read bit line RBL, a source terminal that is connected to intermediate node X, and a gate that is connected to a read word line RWL.

During write operations, write bit line WBL is driven high or low to write a logic "1" or "0" into cell 20. Write word line WWL is asserted to write a desired value into cell 20 while signal WSETN is driven low to disable the pull-down current path of circuit 22 to provide increased write margin.

During read operations, read bit line RBL is precharged to a high voltage. Read word line RWL is asserted to read data from cell 20. If cell 20 is storing a "1" (i.e., the first data storage node is storing a "1"), RBL remains charged at the high voltage. If cell 20 is storing a "0" (i.e., the first data storage node is storing a "0"), RBL discharges towards zero volts through transistors R1 and R2.

Writing a "1" into a SAM cell of the type described in connection with FIGS. 1 and 2 using write access transistor TWA can be unreliable, because n-channel transistor TWA can only pull the first data storage node up to one threshold voltage Vtn below positive supply voltage Vcc. In the presence of variations (e.g., process, voltage, and temperature variations), transistor TWA may be too weak or take too much time to write into the cell.

Figure 3:
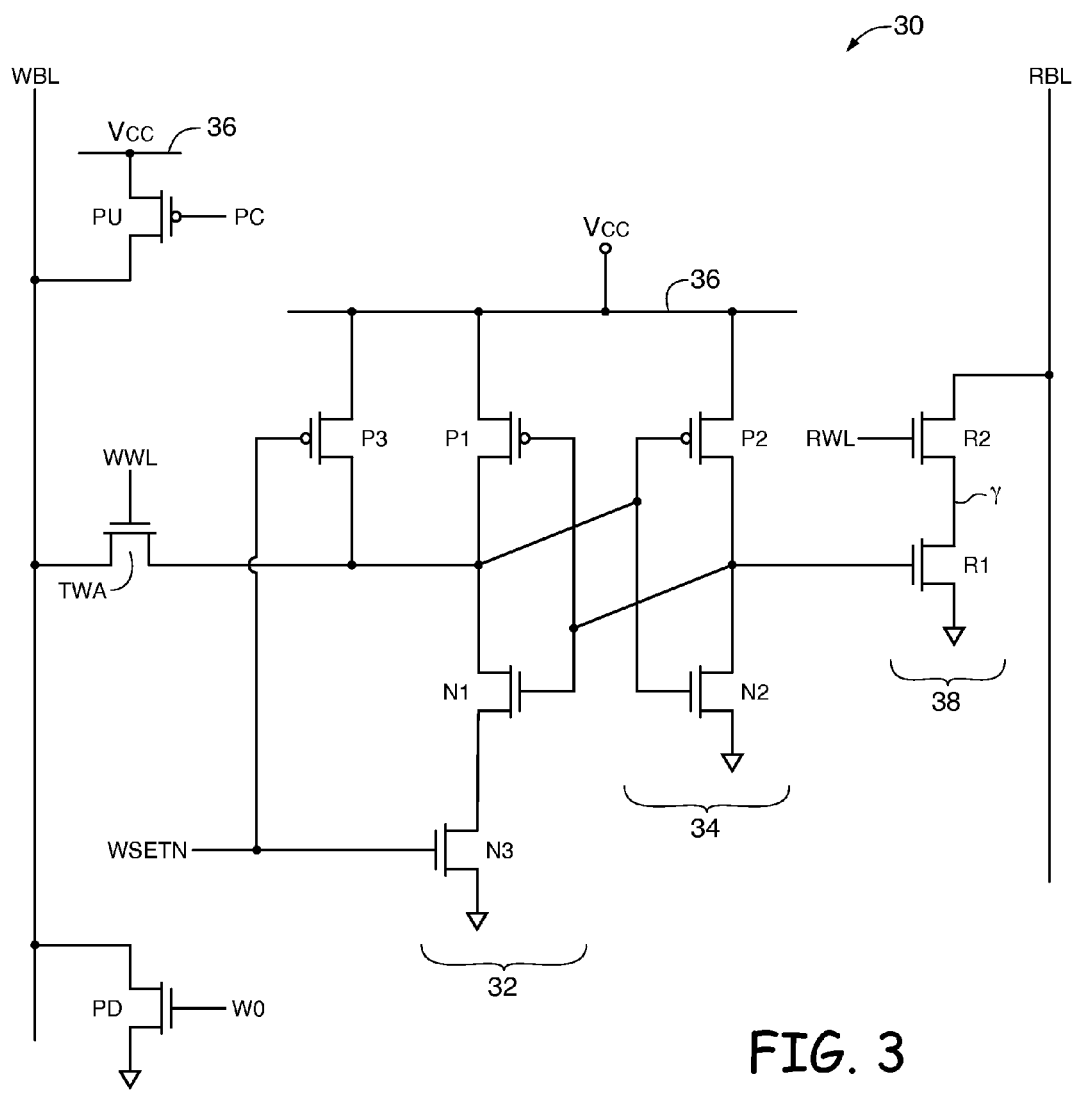
FIG. 3 is a circuit diagram of an illustrative sequential access memory cell in accordance with an embodiment of the present invention.

FIG. 3 is a circuit diagram of an illustrative 9-transistor (9-T) SAM cell with improved write performance. As shown in FIG. 3, 9-T SAM cell 30 may include an inverter-like circuit 32, an inverter 34, a write access transistor TWA, a preset transistor P3, and a read circuit 38.

Cell 30 includes preset transistor P3 to help increase write (preset) performance. Preset transistor P3 may be a p-channel transistor. In contrast to n-channel transistor TWA, p-channel transistor P3 has a greater pull-up strength and can therefore write a "1" into cell 30 in a shorter amount of time. Preset transistor P3 is preferably strong enough to set a "1" into cell 30 (e.g., write a "1" into the first data storage node) under worst case scenarios (e.g., under extreme process, voltage, and temperature variations).

Inverter-like circuit 32 may have an output that is connected to an input of inverter 34, whereas inverter 34 may have an output that is connected to an input of inverter-like circuit 32. Inverter-like circuit 32 and inverter 34 cross-coupled in this way form a storage portion (e.g., a latch) for SAM cell 30. The output of inverter-like circuit 32 may drive a first data storage node, whereas the output of the inverter 34 may drive a second data storage node. Each cell 30 may have a stored data bit held at the first data storage (as an example).

Inverter-like circuit 32 may include a p-channel transistor P1 and n-channel transistors N1 and N3. Transistors P1, N1, and N3 may be connected in series. Transistor P1 may be coupled between a positive power supply line 36 (e.g., a power supply line that is driven to positive power supply voltage Vcc) and the first data storage node. Transistors N1 and N3 may be coupled between the first data storage node and the ground line to form a pull-down current path for circuit 32. Transistors P1 and N1 may have gates that are connected together to form the input of circuit 32, whereas transistor N3 may have a gate that is controlled by control signal WSETN (e.g., a preset control signal).

Preset transistor P3 may be connected between power supply line 36 and the first data storage node (e.g., transistor P3 may be connected in parallel with transistor P1). Preset transistor P3 may have a gate that is controlled by signal WSETN. Transistor P3 may be a p-channel transistor to help SAM cell 10 preset a "1" (e.g., to help write a "1" into the first data storage node). In general, p-channel transistors have a greater pull-up drive strength than n-channel transistors (e.g., preset p-channel transistor P3 can pull the first data storage node all the way up to Vcc, whereas write access n-channel transistor TWA can only pull the first data storage node up to one threshold voltage below Vcc).

Inverter 34 may have a p-channel transistor P2 and an n-channel transistor N2 connected in series. Transistor P2 may be coupled between positive power supply line 36 and the second data storage node, whereas transistor N2 may be coupled between the second data storage node and the ground line. Transistors P2 and N2 may have gates that are connected together to form the input of inverter 34.

Write access transistor TWA of cell 30 connects the first data storage node to a write bit line WBL. Write bit line WBL may sometimes be referred to as a write data line. Transistor TWA has a gate that is connected to a write word line WWL. Write word line WWL may sometimes be referred to as a write address line.

A precharge transistor such as precharge transistor PU may be connected to bit line WBL. Transistor PU may be used during write operations to precharge write bit line WBL. Transistor PU may be a p-channel transistor that is coupled between power supply line 36 and bit line WBL. Transistor PU may have a gate that is controlled by precharge signal PC (see, e.g., FIG. 3).

A write driver (pull-down) transistor such pull-down transistor PD may also be connected to write bit line WBL. Transistor PD may be used during write operations to write a "0" into SAM cell 30. Transistor PD may be an n-channel transistor that is coupled between bit line WBL and the ground line. Transistor PD may have a gate that is controlled by write-zero signal W0.

Read circuit 38 may include n-channel transistors R1 and R2 connected in series. Transistor R1 may have a drain terminal that is connected to an intermediate node Y, a source terminal that is connected to the ground line, and a gate that is connected to the second data storage node (see, e.g., FIG. 3). Transistor R2 may have a drain terminal that is connected to read bit line RBL, a source terminal that is connected to intermediate node Y, and a gate that is controlled by a read word line RWL. Read bit line RBL may sometimes be referred to as a read data line, whereas read word line RWL may sometimes be referred to as a read address line.

During preset operations, preset control signal WSETN may be asserted (i.e., WSETN may be pulled low) to write a "1" into the first data storage node of cell 30. Asserting control signal WSETN turns on preset transistor P3 while disabling transistor N3 to break the pull-down current path of inverter-like circuit 32. Configuring cell 30 to store a "1" using preset transistor P3 can be faster and more reliable than using an n-channel transistor such as transistor TWA to write a "1" into cell 30. Transistor TWA may remain off during preset operations (i.e., word line WWL need not be asserted during preset operations).

During write operations, word line WWL may be raised high while asserting signal W0 to write a "0" into the first data storage node of cell 30. Asserting signal W0 enables transistor PD to pull WBL down towards ground while raising WWL high turns transistor TWA on to discharge the first data storage node towards zero volts. Signal WSETN may remain deasserted (i.e., signal WSETN may remain high) during the writing of a "0" into cell 30.

During read operations, read bit line RBL may be precharged to a high voltage. Read word line RWL can then be asserted to read data from cell 30. If cell 30 is storing a "1" (i.e., the first data storage node is storing a "1"), RBL may remain charged at the high voltage. If cell 30 is storing a "0" (i.e., the first data storage node is storing a "0"), RBL will discharge towards zero volts through transistors R1 and R2. Reading data from cell 30 using read buffer circuit 38 in this way increases read margin, because the second data storage node does not experience undesirable voltage rise during read operations (e.g., because the second data storage node is connected to the gate of read transistor R1).

Figure 4:
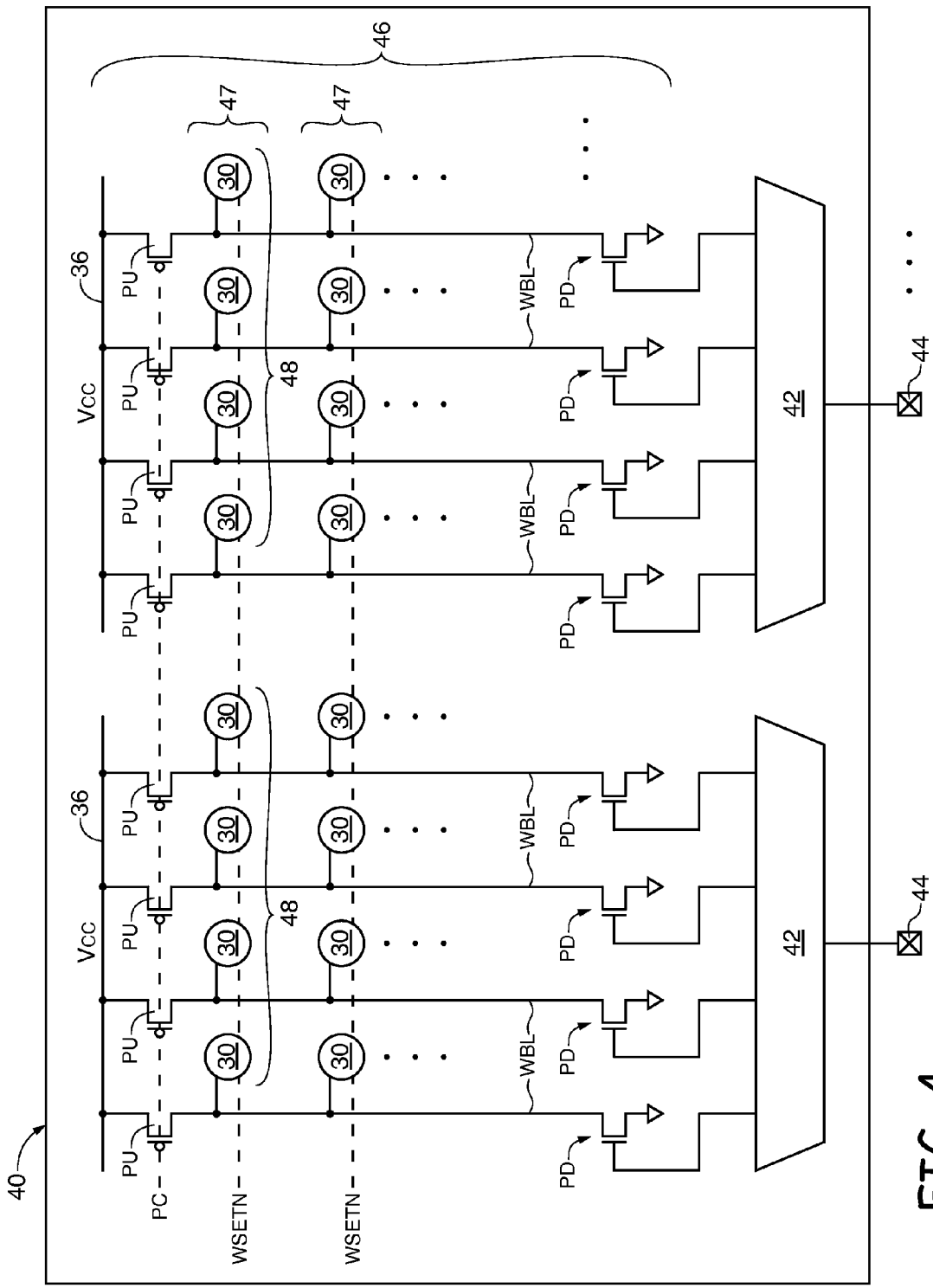
FIG. 4 is a diagram of an illustrative integrated circuit with a sequential access memory array in accordance with an embodiment of the present invention.

FIG. 4 shows how SAM cells 30 may be arranged in a memory array on an integrated circuit. Memory array 46 on integrated circuit 40 may include hundreds or thousands of cells 30 arranged in rows and columns. Each row of memory may be further organized into groups that are sometimes referred to as "words" of memory.

As shown in FIG. 4, each word 48 in row 47 may have four memory cells 30 (as an example). Corresponding write bit lines WBLs of each group of four memory cells may be coupled to an external input-output (I/O) pin such as I/O pin 44 through a column multiplexer 42. Column multiplexer 42 may selectively connect pin 44 to one of the associated WBLs during configuration of memory array 46.

For example, pin 44 may supply the gate of transistor PD with a high voltage if it is desired to write a "0" into a selected cell in that corresponding column. Pin 44 may drive the gate of transistor PD low if it is desired to maintain the preset state in the selected cell (e.g., so that the selected cell holds the "1" that was written during preset operations). Signals provided through pins 44 may be sequentially routed to each of the SAM memory cells in each word 48 so that memory array 46 is loaded with desired values. Each row 47 may be configured in this way.

The arrangement shown in FIG. 4 is merely illustrative. If desired, each word 48 may include a different number of memory cells 30. Each row 47 may have any desired word size (e.g., each row 47 may include any number of words 48).

Figure 5:
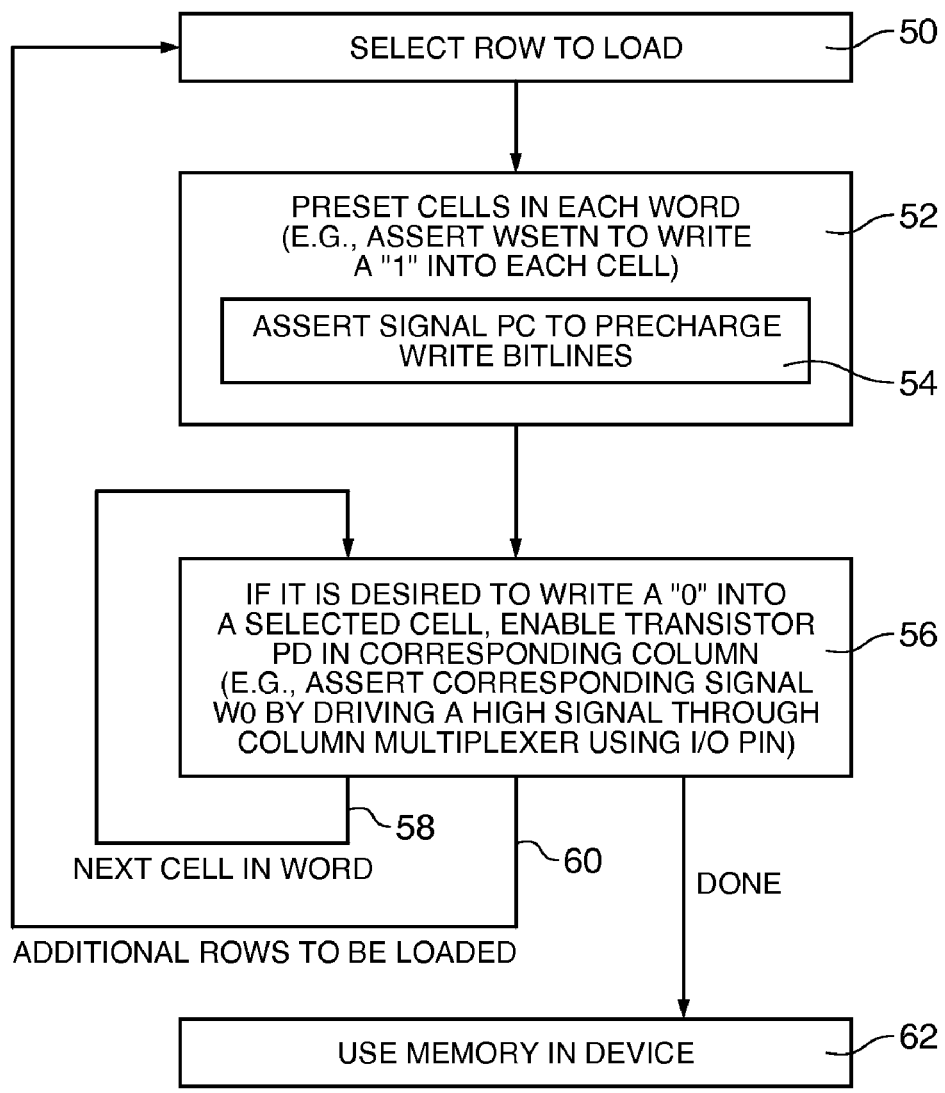
FIG. 5 is a flow chart of illustrative steps involved in configuring a sequential access memory array in accordance with an embodiment of the present invention.

FIG. 5 shows illustrative steps involved in loading a SAM array with desired values. At step 50, a row may be selected for loading. At step 52, control signal WSETN may be asserted to preset (e.g., to write a "1") the SAM cells in all words of the selected row. Write precharge signal PC may be asserted to precharge each write bit line WBL (step 54). Step 54 may be performed simultaneously with step 52.

At step 56, transistor PD of the first column in each word may be selectively connected to associated I/O pin 44 of FIG. 4 using column multiplexer 42. If it is desired to write a "0" into a selected cell, transistor PD may be turned on while asserting WWL of the selected cell. Otherwise, transistor PD may remain off.

Step 56 may be repeated to load the successive cell 30 in the word, as indicated by path 58. Processing may loop back to step 50 to load additional rows, as indicated by path 60. Once the memory array has been loaded with desired values, the integrated circuit device may be used by the integrated circuit in which the memory array is contained (step 62).

Various embodiments have been described illustrating sequential access memory (SAM) elements with improved write performance.

A SAM cell may include an inverter-like circuit, an inverter, a preset transistor, an access transistor, and a read buffer circuit. The inverter-like circuit and the inverter may be cross-coupled together to form a bi-stable storage portion of the cell that can be used to store a data bit. The storage portion may be powered using a positive power supply line. The inverter-like circuit may have an output that drives a first data storage node that stores the data bit, whereas the inverter may have an output that drives a second data storage node. The inverter-like circuit may include a given n-channel transistor in its pull-down current path that can be disabled during write operations.

The preset transistor may be a p-channel transistor that can be used to write a "1" into the cell during preset operations. The preset transistor may be coupled between the positive power supply line and the first data storage node. The preset transistor and the given n-channel transistor may be controlled by a control signal that is asserted (e.g., pulled low) during preset operations to write a "1" into the cell.

The access transistor may be connected between a write bit line and the first data storage node. The access transistor may be used during write operations to write in a "0" into a desired cell.

The read buffer circuit may be coupled between a read bit line and a ground power supply line. The read buffer circuit may include first and second read transistors connected in series. The first read transistor may have a gate that is controlled by a read control signal, whereas the second read transistor has a gate that is connected to the second data storage node.

During read operations, the read bit line may be precharged to a high voltage, and the read control signal may be asserted. If the second data storage node is holding a "1," the read bit line will discharge towards zero volts. If the second data storage node is holding a "0," the read bit line will remain charged at the high voltage. Sensing the data bit stored in a cell using the read buffer circuit increases read margin, because tapping a data storage node with the gate of a transistor prevents voltage rise at the data storage node.

Desired data bits may be loaded into a memory array with SAM cells in sequence. External input-output pins may be used to sequentially write a "0" into each successive SAM cell in an associated word of memory, if desired.

The foregoing is merely illustrative of the principles of this invention which can be practiced in other embodiments.

What is claimed is:

1. A sequential access memory element, comprising:
   first and second transistor pairs that are interconnected to form a bistable element having first and second data storage nodes, wherein the first data storage node is coupled between a first n-channel transistor and a first p-channel transistor in the first transistor pair and wherein the second data storage node is coupled between a second n-channel transistor and a second p-channel transistor in the second transistor pair; and
   a preset transistor that is connected in parallel with the first p-channel transistor in the first transistor pair, wherein the preset transistor has a gate that receives a preset control signal.

2. The sequential access memory element defined in claim 1, wherein the preset transistor is a p-channel transistor.

3. The sequential access memory element defined in claim 1, wherein the first transistor pair further includes an additional transistor connected in series with the first n-channel transistor and the first p-channel transistor.

4. The sequential access memory element defined in claim 3, wherein the preset transistor comprises a p-channel transistor and wherein the additional transistor comprises an n-channel transistor.

5. The sequential access memory element defined in claim 4, wherein the additional transistor has a gate and wherein the gate of the preset transistor and the gate of the additional transistor are controlled by the preset control signal.

6. The sequential access memory element defined in claim 5, further comprising:
   a data line; and
   an access transistor coupled between the data line and the first data storage node.

7. The sequential access memory element defined in claim 6, further comprising:
   an additional data line;
   a control line;
   a ground line; and
   a read circuit that is connected to the second data storage node and that is coupled between the additional data line and the ground line, wherein the read circuit includes first and second read transistors connected in series, wherein the first read transistor has a gate that is connected to the control line, and wherein the second read transistor has a gate that is connected to the second data storage node.

8. The sequential access memory element defined in claim 1, further comprising:
   a data line; and
   an access transistor coupled between the data line and the first data storage node.

9. The sequential access memory element defined in claim 8, further comprising:
   an additional data line;
   a control line;
   a ground line; and
   a read circuit that is connected to the second data storage node and that is coupled between the additional data line and the ground line, wherein the read circuit includes first and second read transistors connected in series, wherein the first read transistor has a gate that is connected to the control line, and wherein the second read transistor has a gate that is connected to the second data storage node.

10. The sequential access memory element defined in claim 1, further comprising:
    a data line;
    a ground line; and
    a read circuit that is connected to the second data storage node and that is coupled between the data line and the ground line.

11. The sequential access memory element defined in claim 10, further comprising:
    a read address line, wherein the read circuit includes first and second read transistors connected in series, wherein the first read transistor has a gate that is connected to the read address line, and wherein the second read transistor has a gate that is connected to the second data storage node.

12. A sequential access memory element operable in first and second write modes, comprising:
    at least first and second transistor pairs that are interconnected to form a bistable element having at least first and second data storage nodes, each data storage node being coupled between a first transistor and a second transistor in a respective one of the first and second transistor pairs;
    a preset circuit, wherein the preset circuit is enabled to write data into the memory element during the first write mode and wherein the preset circuit is disabled during the second write mode; and
    an access circuit, wherein the access circuit is enabled to write data into the memory element during the second write mode and wherein the access circuit is disabled during the first write mode.

13. The sequential access memory element defined in claim 12, wherein the preset circuit comprises a p-channel transistor connected in parallel with the first transistor in the first transistor pair and wherein the preset transistor has a gate that receives a preset control signal.

14. The sequential access memory element defined in claim 13, wherein the access circuit comprises an n-channel transistor.

15. The sequential access memory element defined in claim 14, further comprising:
    a given transistor connected in series with the first transistor and the second transistor in a given one of the first and second transistor pairs.

16. The sequential access memory element defined in claim 13, wherein the given transistor has a gate, wherein the p-channel transistor has a gate, and wherein the gate of the given transistor and the gate of the p-channel transistor are controlled by a control signal.

17. The sequential access memory element defined in claim 16, wherein the memory element is operable in a read mode, the sequential access memory cell further comprising:
    a read circuit having a read transistor, wherein the read transistor has a gate that is connected to a respective one of the first and second data storage nodes and wherein the read circuit senses read data during the read mode.

18. The sequential access memory element defined in claim 12, wherein the memory element is also operable in a read mode, the sequential access memory cell further comprising:
    a read circuit having a read transistor, wherein the read transistor has a gate that is connected to a respective one of the first and second data storage nodes and wherein the read circuit senses read data during the read mode.

19. A sequential access memory element operable in read and write modes, comprising:
    a positive power supply line;
    a bistable element formed from interconnected first and second transistor pairs and having at least first and second data storage nodes, wherein the first data storage node is coupled between a first n-channel transistor and a first p-channel transistor in the first transistor pair and wherein the second data storage node is coupled between a second n-channel transistor and a second p-channel transistor in the second transistor pair, wherein the bistable element includes at least one additional transistor connected in series with the first transistor pair, and wherein the additional transistor is controlled to selectively weaken the bistable element during the write mode; and a preset transistor coupled between the positive power supply line and the first data storage node, wherein the preset transistor is turned on during the write mode and wherein the preset transistor is turned off during the read mode.

20. The sequential access memory element defined in claim 19, wherein the preset transistor comprises a p-channel transistor and wherein the memory element is operable in an additional write mode, the sequential access memory element further comprising:

an access transistor connected to the bistable element, wherein the access transistor is turned on to write data into the memory element during the additional write mode and wherein the access transistor is turned off during the write mode; and a read circuit, wherein the read circuit reads data from the memory element during the read mode.

* * * * *